United States Patent [19]
Ketineni et al.

[11] Patent Number: 5,748,034
[45] Date of Patent: May 5, 1998

[54] COMBINATIONAL LOGIC CIRCUIT, SYSTEM AND METHOD FOR ELIMINATING BOTH POSITIVE AND NEGATIVE GLITCHES

[75] Inventors: Venkateswarrao Ketineni, Fremont; Daniel G. Bezzant, Pleasanton, both of Calif.

[73] Assignee: Cirrus Logic, Inc., Fremont, Calif.

[21] Appl. No.: 714,509

[22] Filed: Sep. 16, 1996

Related U.S. Application Data

[63] Continuation of Ser. No. 486,555, Jun. 7, 1995, abandoned.

[51] Int. Cl.$^6$ ........................................... H03K 5/00
[52] U.S. Cl. .......................... 327/551; 327/552; 327/34; 327/311; 327/166
[58] Field of Search ...................... 327/31, 34, 161, 327/261, 551, 552, 292, 18, 20, 143, 141, 311, 165, 166, 198

[56] References Cited

U.S. PATENT DOCUMENTS

| | | | |
|---|---|---|---|
| 5,184,032 | 2/1993 | Leach | 327/292 |
| 5,198,710 | 3/1993 | Houston | 327/552 |
| 5,265,038 | 11/1993 | Kwok | 327/552 |
| 5,440,178 | 8/1995 | McClure | 327/31 |

*Primary Examiner*—Timothy P. Callahan
*Assistant Examiner*—Ding T. Le
*Attorney, Agent, or Firm*—Steven A. Shaw; J. P. Violette; Robert P. Sabath

[57] ABSTRACT

A host adapter of a computer system includes combinational logic circuit eliminating both positive and negative-glitches from an input signal. The circuit comprises two NAND gates and two delay elements in one embodiment. The delay introduced by second delay element is twice that of the first delay element. The first delay element receives as input the input signal. The first NAND gate receives as inputs the input signal and the output of the first delay element. The second delay element receives as input the output of the first NAND gate. The second NAND gate receives as inputs the output of the first NAND gate and the output of the second delay element. The output of the second NAND gate comprises the input signal with both positive and negative glitches having a duration of less than the delay of the first delay element eliminated. In a second embodiment, the two NAND gates are replaced by two NOR gates.

5 Claims, 7 Drawing Sheets

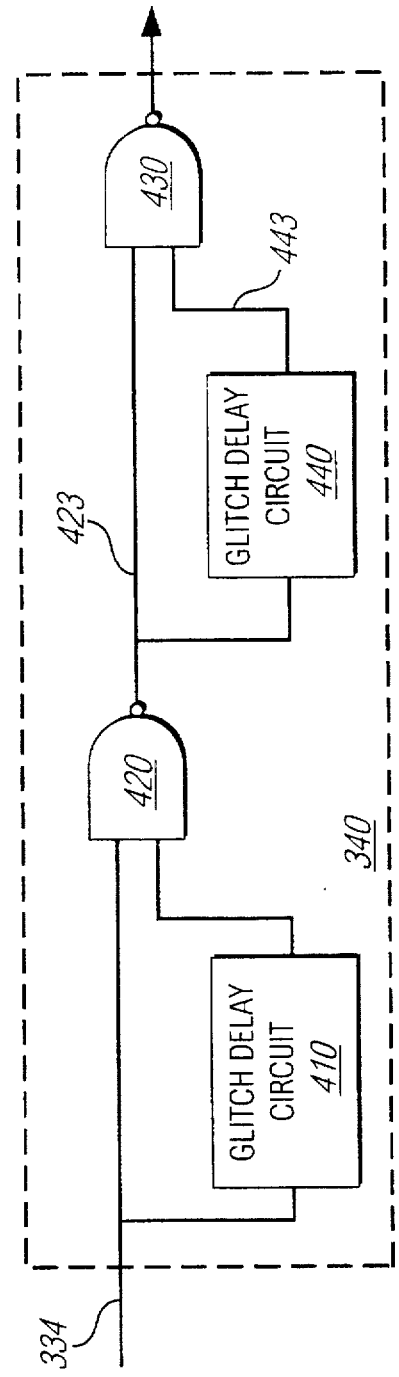
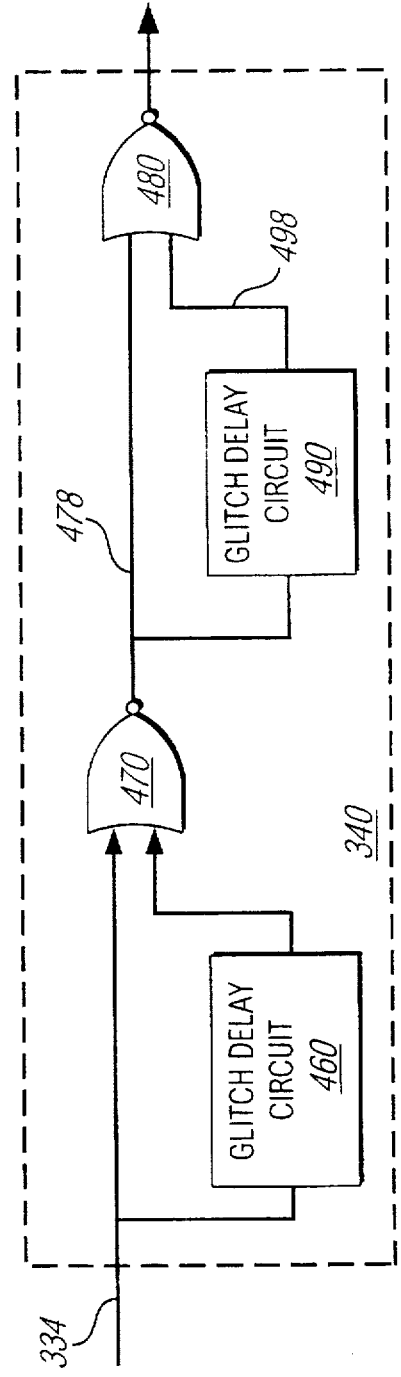
FIG. 3A
FIG. 3B

5,748,034

COMBINATIONAL LOGIC CIRCUIT, SYSTEM AND METHOD FOR ELIMINATING BOTH POSITIVE AND NEGATIVE GLITCHES

This application is a continuation-in-part, of application Ser. No. 08/486,555, filed Jun. 7 1995 and now abandoned.

FIELD OF THE INVENTION

The present invention relates to input/output Interfaces for use in computer systems. More specifically, the present invention relates to a combinational logic circuit for eliminating both positive and negative glitches in a signal in a host adapter of a computer system.

BACKGROUND OF THE INVENTION

Computer systems supporting the PCMCIA standard are well known in the prior art. Typical PCMCIA computer systems provide a host adapter with one or more slots, with each slot designed to receive a card such as a memory card or an I/O card. These cards may be inserted or removed into the slots on the fly, i.e. when the computer system is operational (i.e. in an ON state).

The host adapter is generally designed to provide to a CPU in the computer system an indication of the insertion of a card into (or removal of a card from) a slot. The host adapter may rely on a signal level change to detect such insertion or deletion. For example, in one prior computer system, insertion of a card into a host adapter causes a normally high level signal to transition to a low signal level. When the signal level changes, the host adapter may generate an interrupt and/or set a bit in a register to indicate insertion of the card, and the CPU generally examines that bit to take appropriate action.

One problem known with host adapters relying on signal level changes is that glitches (positive and negative glitches shown in FIG. 1) may be generated in the signal. Such glitches may cause host adapters to detect a change in the signal level and give a wrong indication of multiple insertions or removals to the CPU. The wrong indications may cause an unacceptable additional overhead as the CPU attempts to process the wrong indications. Even worse, a computer system may erroneously abort some operations with the mistaken determination that a card is removed while in reality the card is actually present in the slot.

Some prior computer systems have addressed problems with glitches by designing software to detect wrong indications. The software solutions are usually operative after the host adapter provides a glitch indication to the CPU. Such software solutions have generally been designed for glitches with long duration (for example of the order of milliseconds), but may be inadequate in addressing glitches of shorter duration (for example of the order of nano seconds range) because of the speed in which glitch transitions may occur.

These shorter duration glitches may be caused for several reasons. For example, impedance mismatch between a card and the slot into which the card is inserted or inadequate power and ground biasing in the card, may cause short duration glitches. In addition, the problem may be exacerbated because the impedance mismatch can cause repeated short duration glitches as the mismatch may not be corrected over time while the card is located in the slot.

It is therefore desirable to provide a signal free of glitches within the host adapter when cards are inserted into and removed from corresponding slots. It may be further desirable to eliminate both positive glitches and negative glitches because the host adapter may use both negative to positive transitions and positive to negative transitions to indicate status of insertion or removal of a card from a slot.

Some prior systems have implemented circuits to remove either positive only or negative only glitches using a 'one-shot' style deglitching circuits. Some other prior systems have implemented circuits to remove both positive and negative glitches, which have made use of a clock signal. However such clock signal may not be guaranteed in present computer systems, for example, because the clock signal may be temporarily blocked to some parts of the computer system (including the host adapter) to conserve power. It is therefore desirable that the glitch removal circuit not require a clock signal.

SUMMARY OF THE INVENTION

In accordance with the illustrated embodiment of the present invention, a host adapter (300) for connecting a PCMCIA card to a computer system includes a card slot (320) for receiving a PCMCIA card and card status circuitry (325) for detecting the entry or removal of a PCMCIA card into card slot (320) and producing a glitch-free status signal accessible or delivered to a processor within a computer system.

Card status circuitry (350) includes an input signal generation circuit (330) that provides a status signal to card status (350) which filters erroneous status signals (or glitches) and produces a glitch-free status signal. The glitch-free status signal indicates whether a card (310) is present in card slot (320).

BRIEF DESCRITION OF THE DRAWINGS

FIG. 3A is a block diagram of a first embodiment of the glitch removal circuit of the present invention.

FIG. 3B is a block diagram of a second embodiment of the glitch removal circuit of the present invention.

DETAILED DESCRIPTION OF THE INVENTION

Figure 1:
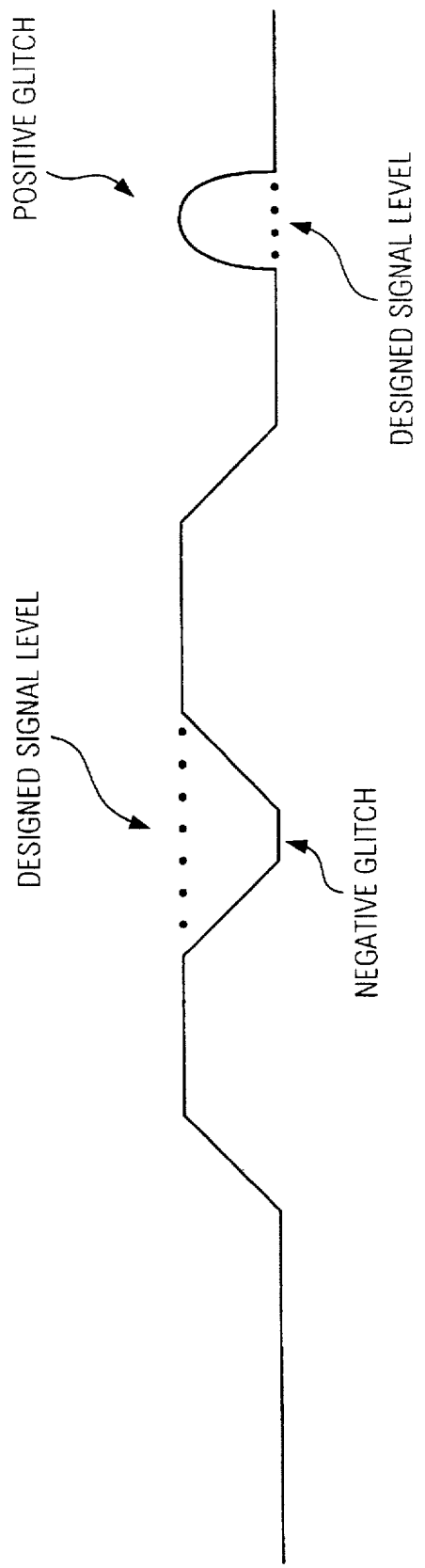
FIG. 1 illustrates positive and negative glitches known in the prior art.
Figure 2:
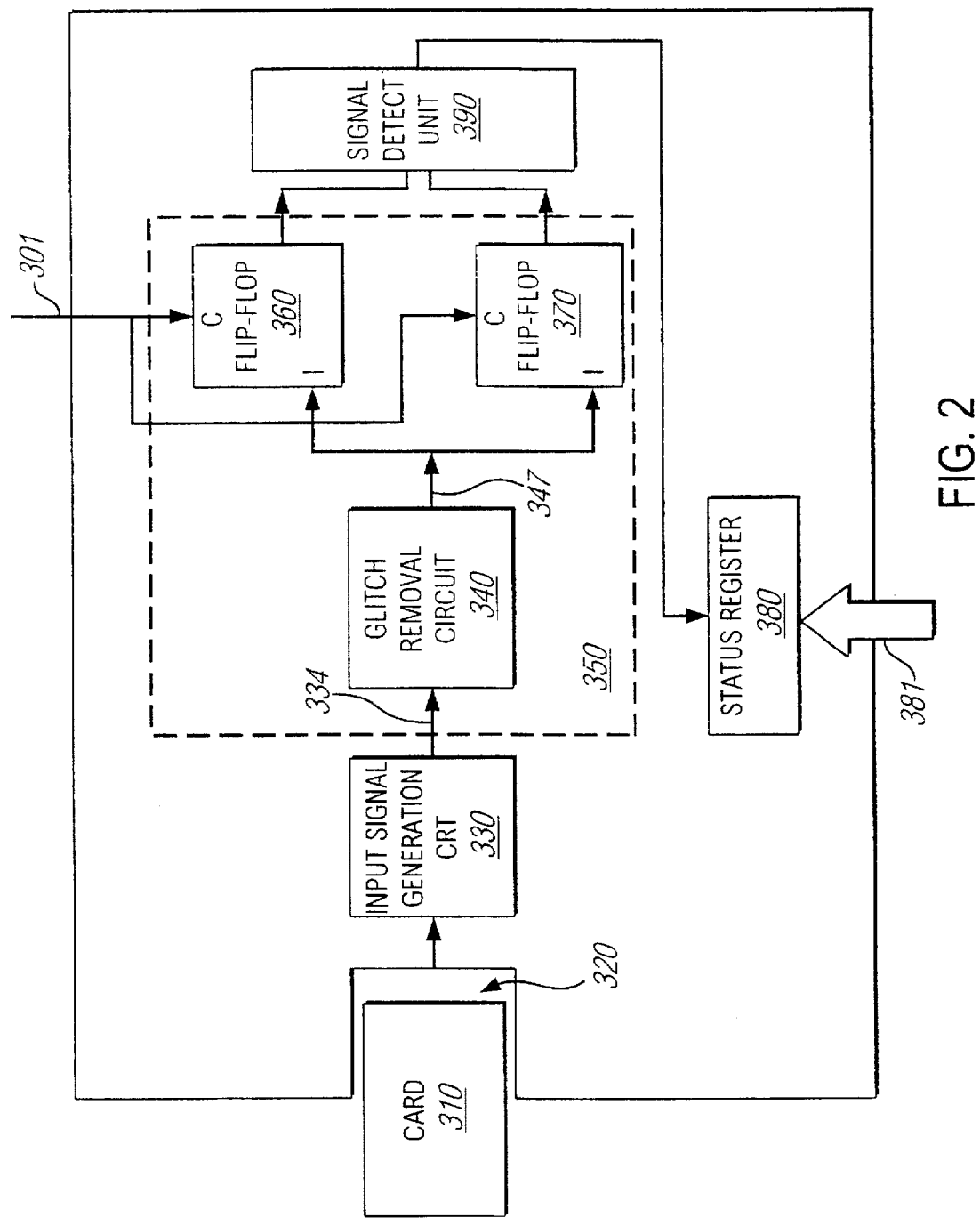
FIG. 2 is a block diagram of a host adapter of the present invention including a glitch removal circuit.

With reference to FIG. 2, a host adapter of the present invention, generally referred to by numeral 300, is shown for connecting PCMCIA card 310 to a computer system (not shown). Host adapter 300 includes card slot 320 which provides a receptacle to receive PCMCIA card 310 and card status circuitry 350 which detects the entry or removal of PCMCIA card 310 into card slot 320 and produces a glitch-free status signal accessible or delivered to a processor within a computer system.

Card status circuitry 350 includes input signal generation circuit 330 that provides a status signal to glitch removal circuitry 340. Glitch removal circuitry 340 filters erroneous status signals (or glitches) and produces a glitch-free status signal indicating whether PCMCIA card 310 is present in card slot 320. Input signal generation circuit 330 is produced from conventional circuitry.

Glitch removal circuitry 340 includes glitch removal circuit 340 which filters a status signal received from input signal generation circuit 330 and generates a glitch-free status signal, first and second trigger flip flops 360, 370 which receive the glitch-free status signal and generate a high or low signal depending upon whether slot 320 is empty or filled, and signal detection unit 390 comprising an OR gate which receives the high or low signal from flip flops 360, 370 and transmits a corresponding signal to card status register 380. Each of the respective elements of host adapter 300 may be produced from conventional circuitry well known in the art.

Slot 320 is designed to receive a card 310. Card 310 can be a PCMCIA card. Input signal generation circuit 330 generates an input signal on an input signal line 334 depending on whether card 310 is inserted or removed from slot 320. The input signal generated may normally be at a high signal level, and may transition to a low signal level upon insertion of card 310 into slot 320. The input signal may continue at the low signal level until the card 310 is removed from slot 320, upon which event the input signal may return to the high signal level.

The input signal may have positive glitches when the input signal is at low signal level, and negative glitches when the input signal is at the high signal level as in the prior art.

Glitch removal circuit 340 of the present invention comprises only combinational logic, and removes both positive and negative glitches from the input signal to generate a deglitched signal on a deglitched signal line 347. The deglitched signal is similar to the input signal but with glitches removed. Hence, the input signal transitions upon insertion or removal of card 310 are preserved by glitch removal circuit 340. Glitch removal circuit 340 is explained further with reference to FIGS. 3A and 3B.

Referring to FIG. 2 again, first trigger flip flop 360 is responsive to positive-to-negative signal transition, and second trigger flip flop 370 is responsive to negative-to-positive signal transition. Therefore, first trigger flip flop 360 generates a logic signal 1 upon insertion of card 310, and second trigger flip flop 370 generates a logic signal of 1 upon removal of card 310.

Both flip flops 360 and 370 have a clear input 301 to reset the output of the flip flops back to logic level 0. Clear input 301 may be used by software to reset the flip flops after recognizing that card 310 has been either inserted or removed.

OR gate 390 generates a logic signal 1 when at least one of the outputs of the flip flops 360, 370 is a logic level 1. Hence, whenever card 310 is inserted or removed from slot 320, the output of OR gate 390 is set to 1.

A bit in card status register 380 is coupled to the output of OR gate 390. This bit is set to 1 when OR gate 390 generates a 1 on the output. A value of 1 in the card status register 380 may trigger an interrupt for a CPU (not shown in figure) to examine the status of slot 320, or software in the computer system may be designed to examine periodically the bit in card status register 380 to determine whether there is a change in the status (i.e. insertion or removal) of the slot 320.

Once the status change is recognized, the bit in the card status register 380 may be reset back to logic level 0. At the same time, the flip flops 360 and 370 may also be reset to logic level 0 by using the clear input 301. The bit in card status register 380 may be reset to logic level 0 when the computer system is turned on.

FIG. 3A is a block diagram of a first embodiment of the glitch removal circuit 340 of the present invention. Glitch removal circuit 340 comprises two NAND gates 420 and 430, and two delay elements 410 and 440. The delay introduced by delay element 440 is at least twice the delay ('d') introduced by delay element 410. The delay elements 410, 440 and NAND gates 420, 430 are otherwise conventional.

As will be explained with respect to FIGS. 4 and 5, glitch removal circuit 340 operates to eliminate positive and negative glitches having a duration less than 'd'. In the preferred embodiment, the value of 'd', has been chosen to be 30 nanoseconds.

Figure 4:
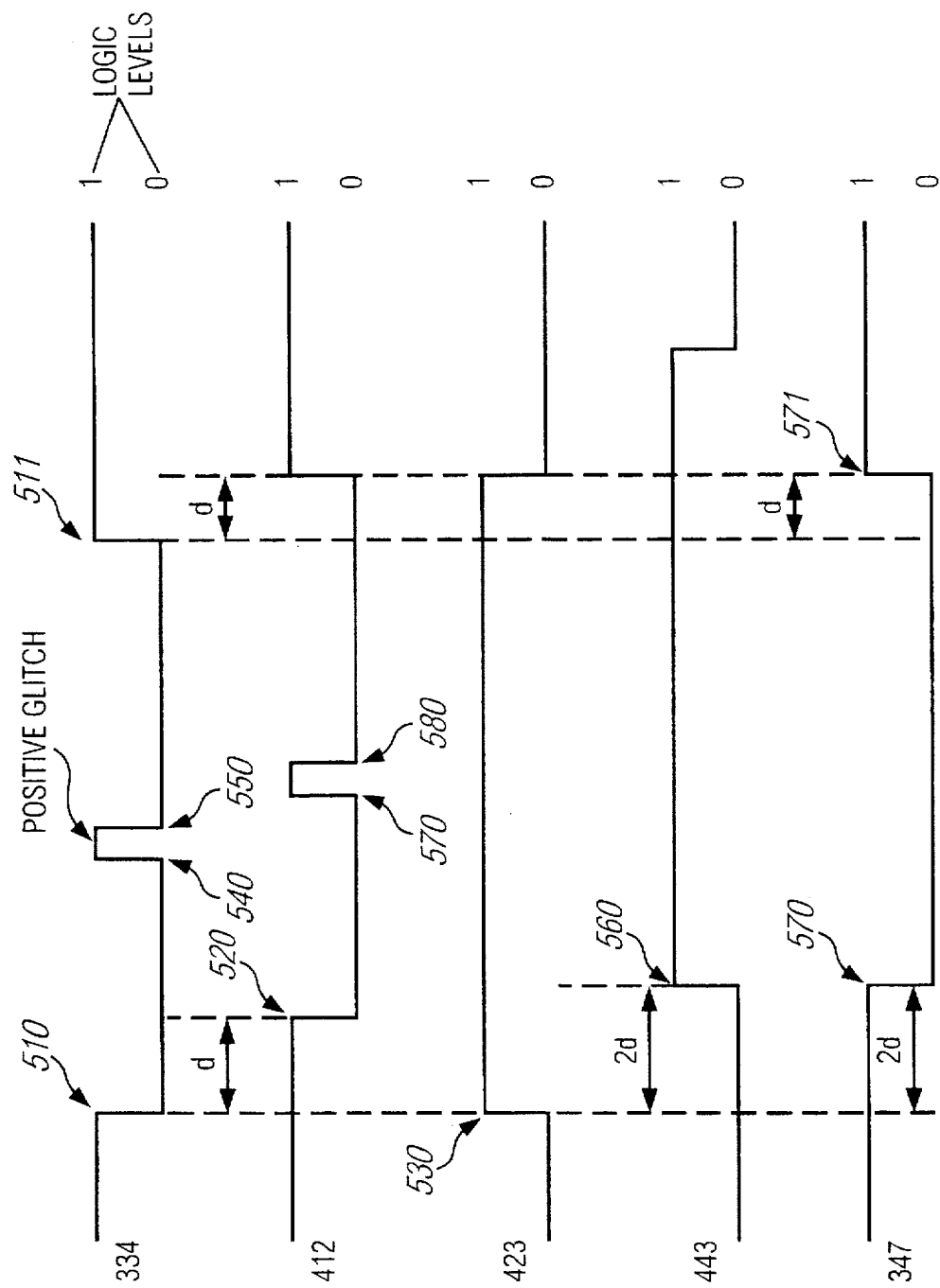
FIG. 4 is a timing diagram for various signals as the first embodiment eliminates positive glitches from the input signal.

FIG. 4 is a timing diagram illustrating the elimination of positive glitches from an input signal generated by input signal generation circuit 330. The signals on the lines 334, 412, 423, 443 and 347 are shown in the process of elimination of a positive glitch.

Referring to FIG. 3A and 4, at time 510, card 310 is inserted into slot 320. The input signal generation circuit 330 drives the input signal line 334 (normally at a high signal level) to a low signal level. A positive glitch is shown between times 540 and 550. The period between 540 and 550 is less than 'd'—the delay introduced by first delay element 410.

The signal on line 412 is the input signal delayed by a period 'd' due to the delay introduced by delay element 410.

The signal on line 423 is the result of the NAND function of the signals on input signal line 334 and line 412. Note that the glitches on input signal line 334 and line 412 are separated in time because both the glitches are of duration less than 'd' and glitch on line 412 is delayed by period 'd'. The separation prevents the glitches from driving both inputs of NAND gate 420 to high logic level at the same time. Since the output of a NAND gate is driven to logic level 0 only if both inputs are at high level, the output of NAND gate 420 remains stable at logic level 1 unaffected by the glitch in the input signal 334.

The signal on line 443 is the signal on line 423 but delayed by 2 times d, i.e. the delay introduced by delay element 440.

The signal on deglitched signal line 347 is the output of the NAND function of the signals on the lines 423 and 443. The high to low transition on the deglitched signal line 347 occurs approximately after a period of 2 times d after similar transition takes place on the input signal line 334. Therefore, the period between 510 and 570 is approximately 2 times d. However, the deglitched signal on deglitched signal line 347 continues at logic level 0 for a period of 'd' after the input signal on input signal line 334 is driven to logic level 0.

It is therefore noted that the positive glitch present in the input signal is eliminated in deglitched signal generated on deglitched signal line 347. It will be appreciated that the input signal generation circuit 330 of the present invention eliminates glitches with duration less than delay 'd'.

A designer can conveniently choose a larger or smaller value than that implemented in the present embodiment to eliminate glitches of corresponding value. It is therefore within the scope and spirit of the present invention to use a delay value of much larger value or much smaller value than that used in the present embodiment.

Figure 5:
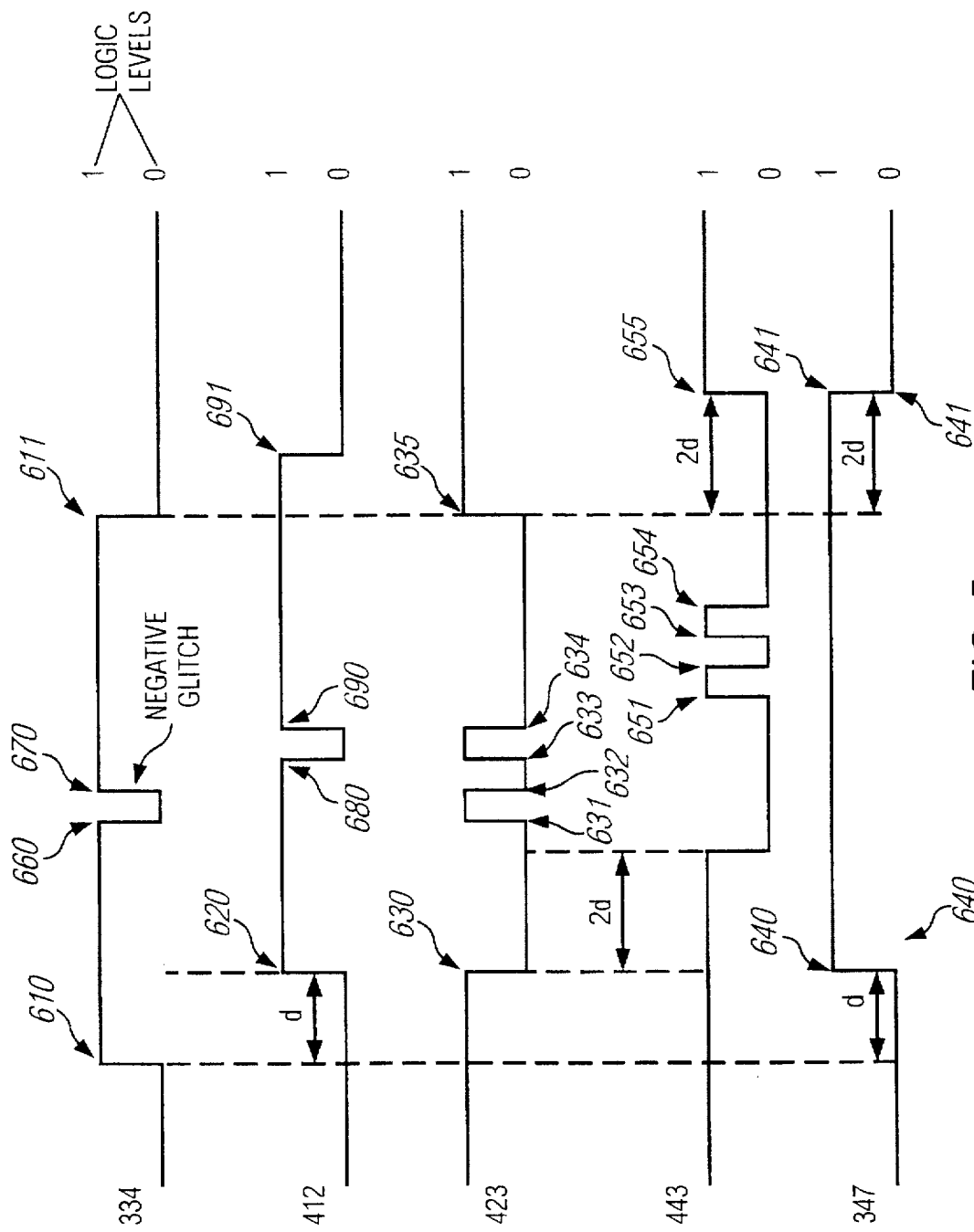
FIG. 5 is a timing diagram for various signals as the first embodiment eliminates negative glitches from the input signal.

FIG. 5 illustrates the elimination of negative glitches by the first embodiment of the glitch removal circuit 340 of present invention. At a time 610, the card 310 is removed causing the input signal generation circuit 330 to drive the input signal from a low signal level to a high signal level. A glitch of duration less than 'd' is shown between times 660 and 670.

The signal on line 412 is the input signal delayed by a period 'd' due to the delay introduced by the delay element 440.

The signal on line 423 is the result of NAND function of signals on input signal line 334 and line 412. Notably two positive glitches (shown during times 631–632 and 633–634) are present in the signal on line 423 corresponding to the times 660–670 and 680–690.

The low level signal between times 632 and 633 is approximately equal to the time period the duration of negative glitch signal is less than 'd'. It will be appreciated that the period between 632 and 633 becomes zero as the period of glitch signal equals 'd'.

The signal on line 443 is the signal on line 423 delayed by a period equal to 2 times 'd' because of the delay introduced by the delay element 440.

The deglitched signal shown on deglitched signal line 347 is the result of NAND function of signals on lines 423 and 443. Since each of the glitches shown during times 631–632 and 633–634 is less than delay 'd', and the time between 631 and 634 is less than 2 times d, these two glitches are separated in time (i.e. glitch 633–634 cannot overlap with the glitches present on line 443). The separation ensures that the output on deglitched signal line 347 is constantly at a high logic level, thereby eliminating the glitches.

Hence, the glitch in the input signal is eliminated in the signal on deglitched signal line 347, and that the transition from low signal level to high signal level is delayed by approximately a period of 'd' compared to the input signal. However, logic level 1 on deglitched signal line 347 continues for a period of 2 times 'd' after the input signal on input signal line 334 transition to logic level 0.

Therefore, the first embodiment of the present invention eliminates both positive and negative glitches from the input signal.

FIG. 3B illustrates a second embodiment of the glitch removal circuit 340 of the present invention. The second embodiment differs from the first embodiment in that the NAND gates are replaced by the NOR gates.

Figure 6:
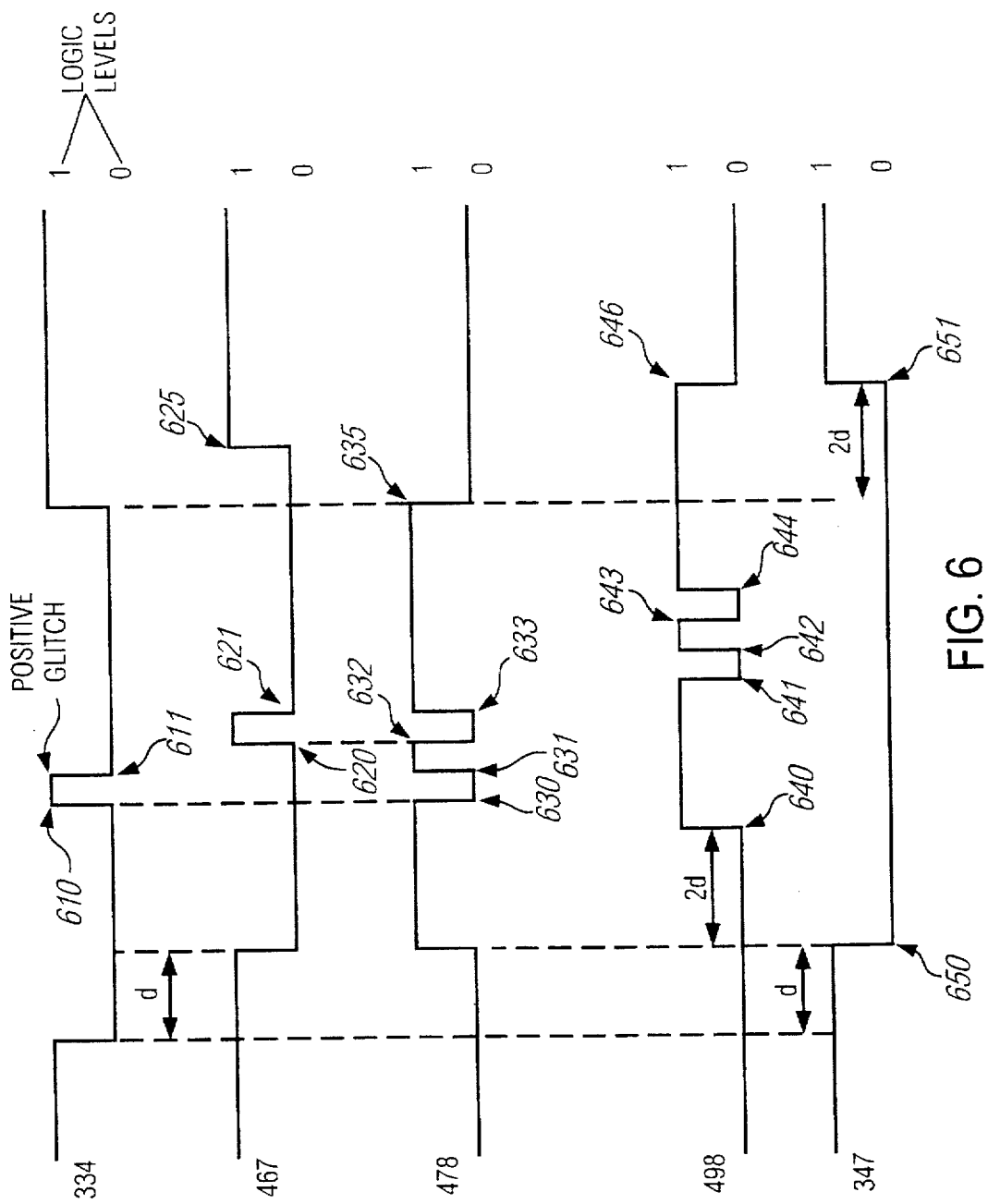
FIG. 6 is a timing diagram for various signals as the second embodiment eliminates positive glitches from the input signal.

FIG. 6 is a timing diagram illustrating the operation of the second embodiment in eliminating positive glitches (exemplary glitch shown between times 610 and 611). The individual signals on line 334, 467, 478, 498 and 347 are explained similar to FIGS. 4 and 5.

The input signal on input signal line 334 is delayed by period 'd' to generate the signal on signal line 467.

The signal on line 478 is a result of NOR function of the signals on input signal line 334 and line 467. The NOR gate 470 generates two negative glitches on line 478 corresponding to the glitches on input signal line 334 and line 467 respectively.

The signal on line 498 is the signal on line 478 delayed by a period of 2 time d.

The signal on line deglitched signal line 347 is the result of NOR operation of the signals on line 498 and deglitched signal line 347. The output on deglitched signal line 347 is constantly low because the glitches on line 478 do not overlap in time with glitches on line 498.

Figure 7:
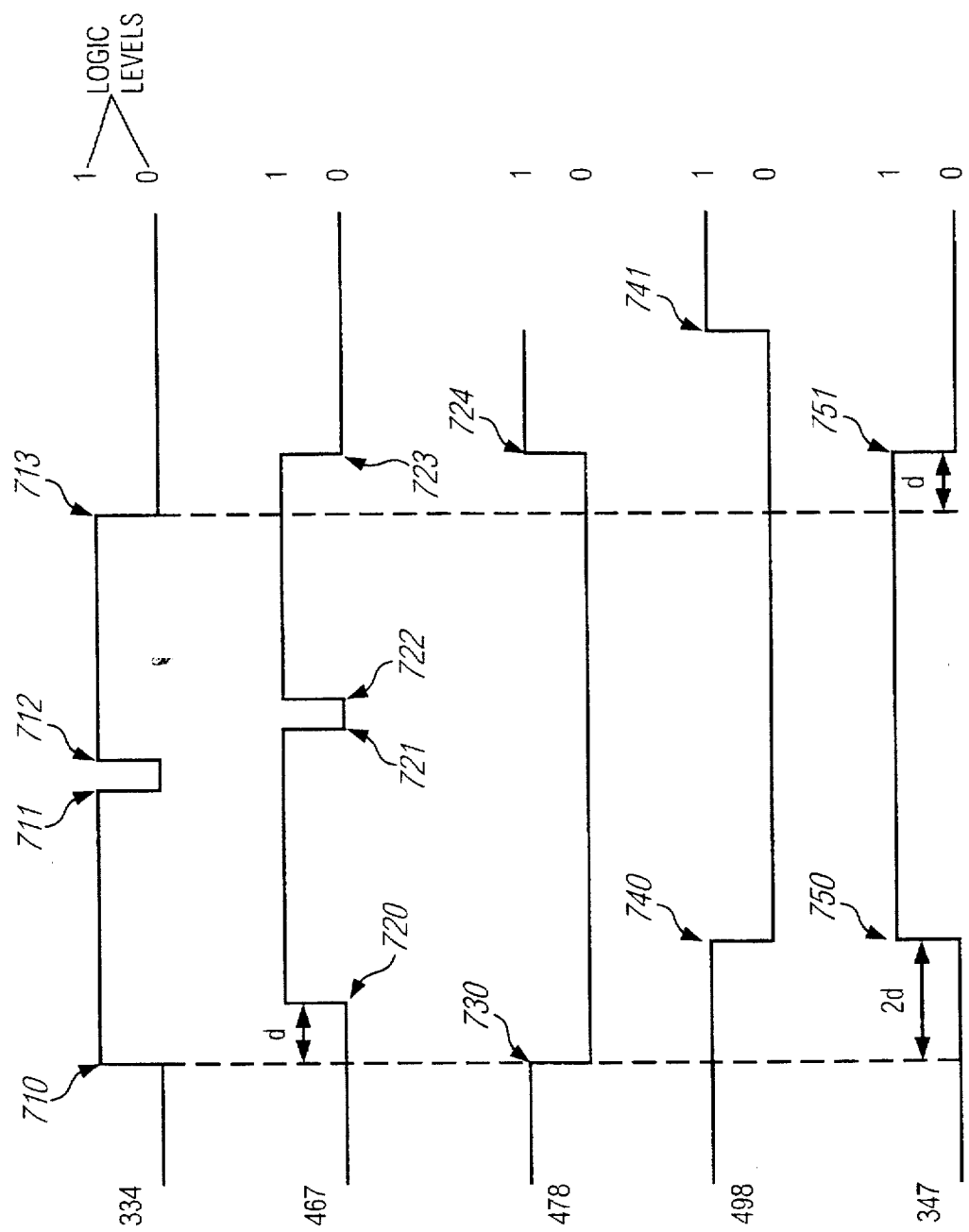
FIG. 7 is a timing diagram for various signals as the second embodiment eliminates negative glitches from the input signal.

FIG. 7 is a timing diagram illustrating the operation of the second embodiment in eliminating a negative glitch (shown between 711 and 712). The individual signals on line 334, 467, 478, 498 and 347 are explained similar to FIGS. 4, 6 and 5.

The input signal on input signal line 334 is delayed by period 'd' to generate the signal on signal line 467.

The signal on line 478 is a result of NOR function of the signals on input signal line 334 and line 467. The NOR gate 470 generates a low level signal with the glitches eliminated.

The signal on line 498 is generated by delaying the signal on line 478 by a period of 2 time 'd'.

The output on deglitched signal line 347 is the result of NOR of signals on lines 478 and 498. In comparison to the input signal, the deglitched signal on deglitched signal line 347 has the positive transition delayed by a period of 2 times d.

Hence both the embodiments of the present invention eliminate positive and negative glitches from the input signal.

A level transition causes one of the trigger flip flops 370, 360 to generate a logic signal 1, which causes the OR gate 390 to generate a 1. The card status register 380 stores a 1 corresponding to the 1 generated by OR gate 390.

The card status register 380 may be examined by a software or an interrupt may be generated to process the change in the status of the slot 320 (i.e. insertion or removal of the card 310). The clear input 301 signal may be used to reset flip flops 360 and 370. The card status register 380 may also be reset to 0 after examination.

Therefore, the glitch removal circuit 340 of the present invention eliminates both positive and negative glitches from the input signal while preserving the level transitions in the input signal. In addition, the circuit comprises only combinational logic and does not require a clock, which makes it suitable for use in devices where a clock signal may not be available.

Since the glitches are eliminated before the host adapter 300 provides an indication to the computer system, the unneeded overhead that may have resulted in the prior art systems is also eliminated.

The foregoing has described the principles, preferred embodiments and modes of operation of the present invention. However, the invention should not be construed as limited to the particular embodiments discussed. Instead, the above described embodiments should be regarded as illustrative rather than restrictive, and it should be appreciated that variations can be made in the embodiments by people skilled in the art without departing from the scope and spirit of the present invention as defined by the following claims.

What we claim is:

1. A host adapter comprising:

a card slot for receiving a personal computer (PC) circuitry card;

an input signal generation circuit coupled to said card slot for generating input signals including input card receipt and card removal signals to indicate whether said card slot has received said PC card or said PC card has been removed from said slot, wherein said input signals include a plurality of positive or negative glitches;

a glitch removal circuit coupled to said input signal generation circuit to receive and monitor said input card signals in order to remove said positive and negative glitches on said input card signals, said glitch removal circuit generating a deglitched input card signal;

a first flip flop coupled to said glitch removal circuit to receive a positive edge of said deglitched input card signal indicating the receipt of said PC card in said card slot, said first flip flop producing a card receipt signal responsive to the receipt of said PC card in said card slot;

a second flip flop coupled to said glitch removal circuit to receive a negative edge of said deglitched input card signal indicating the removal of said PC card from said card slot, said second flip flop generating a card removal output signal responsive to the removal of said PC card from said card slot; and a logic signal generation unit coupled to said first and said second flip flops to receive said card receipt signal and said card remove signal respectively from said first and said second flip flops, said logic signal generating unit generating a corresponding output signal to indicate which of said card receipt and said card remove signals have been received in said host adapter.

2. A host adapter comprising a personal computer (PC) circuitry card based computer system, comprising:

a card reception slot for coupling said PC card to said computer system;

a signal generation circuit coupled to said card slot for generating input signals responsive to whether said PC card has been inserted or removed from said card slot, said signal generating circuit effective for generating a plurality of positive and negative glitched signals;

a signal glitch removal circuit coupled to said signal generation circuit to remove positive or negative glitches accompanying said input signals, said glitch removal circuit generating a first and a second set of deglitched signals;

a first flip flop coupled to said glitch removal circuit to receive said first set of deglitched signals indicative of said PC card having been inserted into said card slot;

a second flip flop coupled to said glitch removal circuit to receive said second set of deglitched signals indicative of said PC card having been removed from said card slot;

a signal logic generating means coupled to said first and second plurality of flip flops for generating a status signal indicating whether said PC card has been inserted or removed from said card slot; and a status register coupled to said signal logic generating means for triggering a system interrupt to said CPU when a PC card is removed from or is inserted into said card slot.

3. The computer system of claim 2 wherein said signal logic generating means includes an OR gate.

4. The computer system of claim 2 further wherein said first flip flop receives said deglitched signals responsive to a positive to negative transition of said card slot.

5. The computer system of claim 2 wherein said second flip flop receives said deglitched signal responsive to a negative to positive signal transition of said card slot.

* * * * *